(12) United States Patent
Kweon et al.

(10) Patent No.: US 7,910,385 B2
(45) Date of Patent: Mar. 22, 2011

(54) METHOD OF FABRICATING MICROELECTRONIC DEVICES

(75) Inventors: Young Do Kweon, Boise, ID (US); J. Michael Brooks, Caldwell, ID (US); Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 153 days.

(21) Appl. No.: 11/433,015

(22) Filed: May 12, 2006

(65) Prior Publication Data

US 2007/0262436 A1 Nov. 15, 2007

(51) Int. Cl.
*H01L 23/58* (2006.01)
*H01L 21/66* (2006.01)

(52) U.S. Cl. .......... 438/18; 438/113; 438/126; 438/460; 257/48; 257/782; 257/787; 257/E23.01; 257/E21.499; 257/E21.505

(58) Field of Classification Search .................. None
See application file for complete search history.

(56) References Cited

U.S. PATENT DOCUMENTS

| | | |
|---|---|---|
| 5,128,831 A | 7/1992 | Fox, III et al. |
| 5,252,857 A | 10/1993 | Kane et al. |
| 5,518,957 A | 5/1996 | Kim et al. |
| 5,593,927 A | 1/1997 | Farnworth et al. |
| 5,677,566 A | 10/1997 | King et al. |
| 5,696,033 A | 12/1997 | Kinsman |
| 5,739,050 A | 4/1998 | Farnworth |
| 5,739,585 A | 4/1998 | Akram et al. |
| D394,844 S | 6/1998 | Wood et al. |
| 5,765,277 A | 6/1998 | Jin et al. |
| 5,815,000 A | 9/1998 | Farnworth et al. |
| D402,638 S | 12/1998 | Farnworth et al. |
| 5,851,845 A | 12/1998 | Wood et al. |
| 5,883,426 A | 3/1999 | Tokuno et al. |
| 5,891,753 A | 4/1999 | Akram |
| 5,891,797 A | 4/1999 | Farrar |
| 5,893,726 A | 4/1999 | Farnworth et al. |
| 5,894,218 A | 4/1999 | Farnworth et al. |
| 5,898,224 A | 4/1999 | Akram |
| 5,933,713 A | 8/1999 | Farnworth |
| 5,938,956 A | 8/1999 | Hembree et al. |
| 5,946,553 A | 8/1999 | Wood et al. |
| 5,958,100 A | 9/1999 | Farnworth et al. |
| 5,986,209 A | 11/1999 | Tandy |
| 5,989,941 A | 11/1999 | Wensel |
| 5,990,566 A | 11/1999 | Farnworth et al. |
| 5,994,784 A | 11/1999 | Ahmad |

(Continued)

OTHER PUBLICATIONS

Intel Corporation, "Bumpless Build-Up Layer Packaging Technology Backgrounder," 4 pages, Oct. 8, 2001,<ftp://download.intel.com/research/silicon/BBULBackgrounder.pdf>.

(Continued)

*Primary Examiner* — Alonzo Chambliss
(74) *Attorney, Agent, or Firm* — Perkins Coie LLP

(57) ABSTRACT

Microelectronic devices and methods for manufacturing microelectronic devices are described herein. An embodiment of one such method includes attaching a plurality of singulated microelectronic dies to a removable support member with an active side of the individual dies facing toward the support member, depositing a flowable material onto the dies and a portion of the removable support member such that the flowable material covers a back side of the individual dies and is disposed between adjacent dies, and removing the support member from the active sides of the dies.

17 Claims, 13 Drawing Sheets

U.S. PATENT DOCUMENTS

| | | | |
|---|---|---|---|
| RE36,469 E | 12/1999 | Wood et al. | |
| 6,004,867 A | 12/1999 | Kim et al. | |
| 6,008,070 A | 12/1999 | Farnworth | |
| 6,008,074 A | 12/1999 | Brand | |
| 6,018,249 A | 1/2000 | Akram et al. | |
| 6,020,624 A | 2/2000 | Wood et al. | |
| 6,020,629 A | 2/2000 | Farnworth et al. | |
| 6,025,728 A | 2/2000 | Hembree et al. | |
| 6,028,365 A | 2/2000 | Akram et al. | |
| 6,046,496 A | 4/2000 | Corisis et al. | |
| 6,048,744 A | 4/2000 | Corisis et al. | |
| 6,048,755 A | 4/2000 | Jiang et al. | |
| 6,049,125 A | 4/2000 | Brooks et al. | |
| 6,051,878 A | 4/2000 | Akram et al. | |
| 6,066,513 A * | 5/2000 | Pogge et al. | 438/113 |
| 6,072,233 A | 6/2000 | Corisis et al. | |
| 6,072,236 A | 6/2000 | Akram et al. | |
| 6,072,323 A | 6/2000 | Hembree et al. | |
| 6,075,288 A | 6/2000 | Akram | |
| 6,081,429 A | 6/2000 | Barrett | |
| 6,089,920 A | 7/2000 | Farnworth et al. | |
| 6,094,058 A | 7/2000 | Hembree et al. | |
| 6,097,087 A | 8/2000 | Farnworth et al. | |
| 6,103,547 A | 8/2000 | Corisis et al. | |
| 6,107,122 A | 8/2000 | Wood et al. | |
| 6,107,680 A | 8/2000 | Hodges | |
| 6,117,382 A | 9/2000 | Thummel | |
| 6,124,634 A | 9/2000 | Akram et al. | |
| 6,130,474 A | 10/2000 | Corisis | |
| 6,148,509 A | 11/2000 | Schoenfeld et al. | |
| 6,150,717 A | 11/2000 | Wood et al. | |
| 6,159,764 A | 12/2000 | Kinsman et al. | |
| 6,159,767 A | 12/2000 | Eichelberger | |
| 6,163,956 A | 12/2000 | Corisis | |
| 6,172,419 B1 | 1/2001 | Kinsman | |
| 6,175,149 B1 | 1/2001 | Akram | |
| 6,184,465 B1 | 2/2001 | Corisis | |
| 6,187,615 B1 | 2/2001 | Kim et al. | |
| 6,188,232 B1 | 2/2001 | Akram et al. | |
| 6,198,172 B1 | 3/2001 | King et al. | |
| 6,201,304 B1 | 3/2001 | Moden | |
| 6,208,156 B1 | 3/2001 | Hembree | |
| 6,208,519 B1 | 3/2001 | Jiang et al. | |
| 6,210,992 B1 | 4/2001 | Tandy et al. | |
| 6,212,767 B1 | 4/2001 | Tandy | |
| 6,214,716 B1 | 4/2001 | Akram | |
| 6,215,175 B1 | 4/2001 | Kinsman | |
| 6,225,689 B1 | 5/2001 | Moden et al. | |
| 6,228,548 B1 | 5/2001 | King et al. | |
| 6,228,687 B1 | 5/2001 | Akram et al. | |
| 6,229,202 B1 | 5/2001 | Corisis | |
| 6,232,666 B1 | 5/2001 | Corisis et al. | |
| 6,235,552 B1 | 5/2001 | Kwon et al. | |
| 6,235,554 B1 | 5/2001 | Akram et al. | |
| 6,239,489 B1 | 5/2001 | Jiang | |
| 6,246,108 B1 | 6/2001 | Corisis et al. | |
| 6,247,629 B1 | 6/2001 | Jacobson et al. | |
| 6,252,308 B1 | 6/2001 | Akram et al. | |
| 6,255,833 B1 | 7/2001 | Akram et al. | |
| 6,258,623 B1 | 7/2001 | Moden et al. | |
| 6,258,624 B1 | 7/2001 | Corisis | |
| 6,259,153 B1 | 7/2001 | Corisis | |
| 6,265,766 B1 | 7/2001 | Moden | |
| 6,271,469 B1 | 8/2001 | Ma et al. | |
| 6,277,671 B1 | 8/2001 | Tripard | |
| 6,281,042 B1 | 8/2001 | Ahn et al. | |
| 6,281,577 B1 | 8/2001 | Oppermann et al. | |
| 6,284,571 B1 | 9/2001 | Corisis et al. | |
| 6,285,204 B1 | 9/2001 | Farnworth | |
| 6,291,894 B1 | 9/2001 | Farnworth et al. | |
| 6,294,839 B1 | 9/2001 | Mess et al. | |
| 6,297,547 B1 | 10/2001 | Akram | |
| 6,303,981 B1 | 10/2001 | Moden | |
| 6,303,985 B1 | 10/2001 | Larson et al. | |
| 6,310,390 B1 | 10/2001 | Moden | |
| 6,314,639 B1 | 11/2001 | Corisis | |
| 6,316,285 B1 | 11/2001 | Jiang et al. | |
| 6,326,242 B1 | 12/2001 | Brooks et al. | |
| 6,326,244 B1 | 12/2001 | Brooks et al. | |
| 6,326,687 B1 | 12/2001 | Corisis | |
| 6,326,697 B1 | 12/2001 | Farnworth | |
| 6,326,698 B1 | 12/2001 | Akram | |
| 6,329,220 B1 | 12/2001 | Bolken et al. | |
| 6,329,222 B1 | 12/2001 | Corisis et al. | |
| 6,331,221 B1 | 12/2001 | Cobbley | |
| 6,331,453 B1 | 12/2001 | Bolken et al. | |
| 6,332,766 B1 | 12/2001 | Thummel | |
| 6,365,434 B1 | 4/2002 | Rumsey et al. | |
| 6,407,381 B1 | 6/2002 | Glenn et al. | |
| 6,429,528 B1 | 8/2002 | King et al. | |
| 6,437,586 B1 | 8/2002 | Robinson | |
| 6,451,624 B1 | 9/2002 | Farnworth et al. | |
| 6,451,709 B1 | 9/2002 | Hembree | |
| 6,483,044 B1 | 11/2002 | Ahmad | |
| 6,501,165 B1 | 12/2002 | Farnworth et al. | |
| 6,503,780 B1 | 1/2003 | Glenn et al. | |
| 6,521,485 B2 | 2/2003 | Su et al. | |
| 6,548,376 B2 | 4/2003 | Jiang | |
| 6,548,757 B1 | 4/2003 | Russell et al. | |
| 6,552,910 B1 | 4/2003 | Moon et al. | |
| 6,558,600 B1 | 5/2003 | Williams et al. | |
| 6,560,117 B2 | 5/2003 | Moon et al. | |
| 6,561,479 B1 | 5/2003 | Eldridge | |
| 6,564,979 B2 | 5/2003 | Savaria | |
| 6,576,494 B1 | 6/2003 | Farnworth | |
| 6,576,495 B1 | 6/2003 | Jiang et al. | |
| 6,576,531 B2 | 6/2003 | Peng et al. | |
| 6,589,820 B1 | 7/2003 | Bolken | |
| 6,607,937 B1 | 8/2003 | Corisis | |
| 6,614,092 B2 | 9/2003 | Eldridge et al. | |
| 6,614,104 B2 | 9/2003 | Farnworth et al. | |
| 6,622,380 B1 | 9/2003 | Grigg | |
| 6,638,595 B2 | 10/2003 | Rumsey et al. | |
| 6,644,949 B2 | 11/2003 | Rumsey et al. | |
| 6,646,334 B2 | 11/2003 | Hur | |
| 6,653,173 B2 | 11/2003 | Bolken | |
| 6,670,719 B2 | 12/2003 | Eldridge et al. | |
| 6,672,325 B2 | 1/2004 | Eldridge | |
| 6,673,649 B1 | 1/2004 | Hiatt et al. | |
| 6,700,210 B1 | 3/2004 | Smith | |
| 6,753,207 B2 | 6/2004 | Hur et al. | |
| 6,770,971 B2 * | 8/2004 | Kouno et al. | 257/734 |
| 6,946,325 B2 * | 9/2005 | Yean et al. | 438/112 |
| 7,122,407 B2 * | 10/2006 | Kim et al. | 438/127 |
| 7,221,041 B2 * | 5/2007 | Lin et al. | 257/666 |
| 7,326,592 B2 * | 2/2008 | Meyer et al. | 438/110 |
| 2004/0021477 A1 * | 2/2004 | Tay et al. | 324/755 |
| 2004/0033654 A1 | 2/2004 | Yamagata | |
| 2004/0058472 A1 | 3/2004 | Shim | |
| 2004/0110323 A1 * | 6/2004 | Becker et al. | 438/127 |
| 2004/0178495 A1 * | 9/2004 | Yean et al. | 257/723 |
| 2004/0245608 A1 * | 12/2004 | Huang et al. | 257/676 |
| 2005/0062155 A1 * | 3/2005 | Tsai | 257/738 |
| 2005/0199994 A1 * | 9/2005 | Morishita et al. | 257/686 |
| 2006/0006534 A1 | 1/2006 | Yean et al. | |
| 2006/0046347 A1 | 3/2006 | Wood et al. | |

OTHER PUBLICATIONS

Towle, Steven N. et al., "Bumpless Build-Up Layer Packaging," 7 pages, Nov. 12, 2001, <ftp://download.intel.com/research/silicon/BBULASME1101paper.pdf>.

Shellcase Inc., "Wafer Level Packaging, ShellBGA Process Flow," 12 pages. Nov. 2001, <http://www.shellcase.com/Attach/ShellBGA_Process_Flow-December_2001.pdf>.

Shellcase, Inc., "Wafer Level Packaging, ShellOP Process Flow," 10 pages, Oct. 2001, <http://www.shellcase.com/Attach/ShellOP_Process_Flow_October_2001.pdf>.

Shinko Electric Industries Co., Ltd., "Chip BGA," 1 page, 2001, <http://www.shinko.co.jp/e_product/e_wlp/e_chipbga.htm>.

Shinko Electric Industries Co., Ltd., "Super CSP," 1 page, 2001, <http://www.shinko.co.jp/e_product/e_wlp/e_scsp.htm>..
</TD></TR>.

* cited by examiner

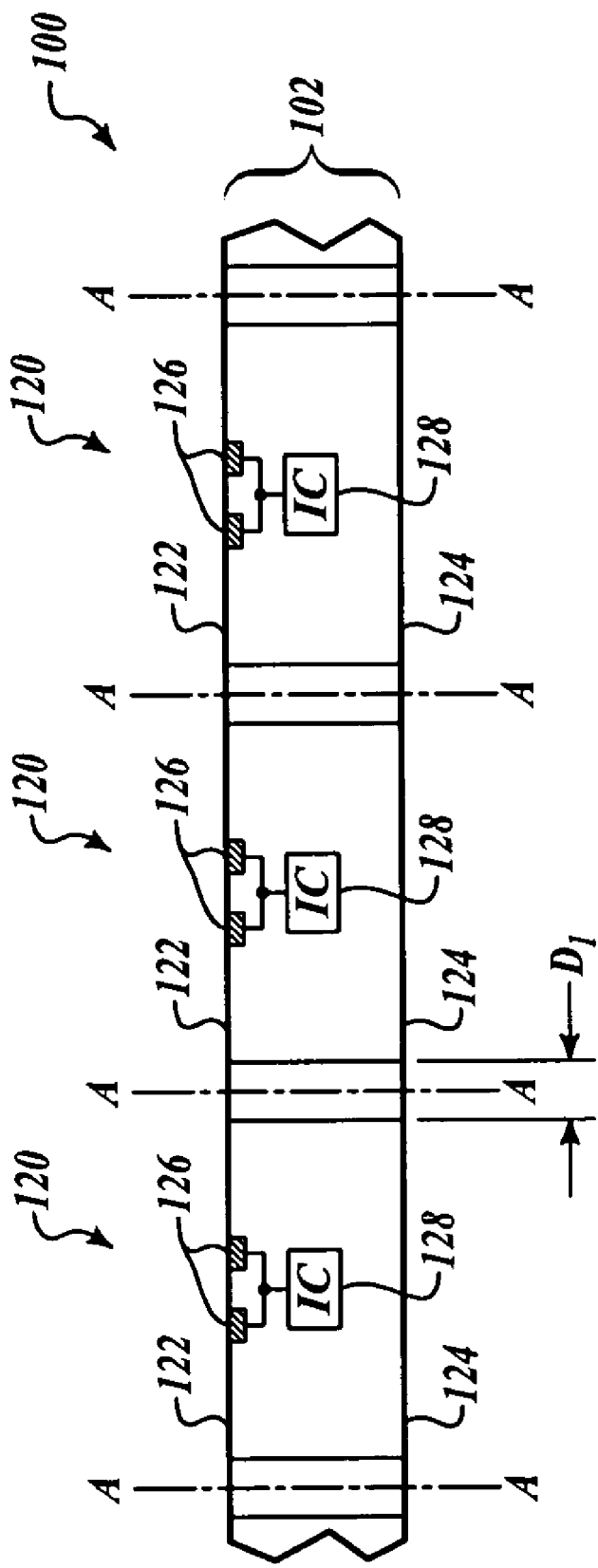

METHOD OF FABRICATING MICROELECTRONIC DEVICES

TECHNICAL FIELD

The present invention is related to microelectronic devices and methods for manufacturing microelectronic devices.

BACKGROUND

Microelectronic devices generally have a die (i.e., a chip) that includes integrated circuitry having a high density of very small components. In a typical process, a large number of dies are manufactured on a single wafer using many different processes that may be repeated at various stages (e.g., implanting, doping, photolithography, chemical vapor deposition, plasma vapor deposition, plating, planarizing, etching, etc.). The dies typically include an array of very small bond-pads electrically coupled to the integrated circuitry. The bond-pads are the external electrical contacts on the die through which the supply voltage, signals, etc., are transmitted to and from the integrated circuitry. After forming the dies, the wafer is thinned by backgrinding and then the dies are separated from one another (i.e., singulated) by dicing the wafer. Next, the dies are typically "packaged" to connect the bond-pads to a larger array of electrical terminals that can be more easily coupled to the various power supply lines, signal lines, and ground lines.

Conventional die-level packaging processes include (a) attaching individual dies to an interposer substrate, (b) wire-bonding the bond-pads of the dies to the terminals of the interposer substrate, (c) encapsulating the dies with a molding compound, and (d) testing the encapsulated dies. Die-level packaging, however, has several drawbacks. First, the dies are typically tested only after being attached to the substrate because the bond-pads are too small to be accurately and consistently contacted by conventional testing equipment. As a result, packaging resources are expended packaging defective dies. Second, it is time consuming and expensive to mount individual dies to interposer substrates or lead frames. Third, as the demand for higher pin counts and smaller packages increases, it becomes more difficult to form robust wirebonds that can withstand the forces involved in molding processes.

Another process for packaging microelectronic devices is wafer-level packaging. In wafer-level packaging, a plurality of microelectronic dies are formed on a wafer, and then a redistribution layer is formed over the dies. The redistribution layer has a dielectric layer, a plurality of ball-pad arrays on the dielectric layer, and a plurality of conductive traces in the dielectric layer. Each ball-pad array is arranged over a corresponding die, and the ball-pads in each array are coupled to corresponding bond-pads of the die with the conductive traces. After forming the redistribution layer on the wafer, a highly accurate stenciling machine deposits discrete masses of solder paste onto the individual ball-pads. The solder paste is then reflowed to form small solder balls or "solder bumps" on the ball-pads. After forming the solder balls, the wafer is singulated to separate the individual microelectronic devices from one another. The individual microelectronic devices are subsequently attached to a substrate such as a printed circuit board. Microelectronic devices packaged at the wafer-level can have high pin counts in a small area, but they are not as robust as devices packaged at the die-level.

Wafer-level packaged devices are typically stress tested only after attachment to the substrates to avoid damaging the redistribution layers and/or the dies. Specifically, conventional test sockets can accumulate debris that would scratch, impinge, pierce, contaminate, and/or otherwise damage the components within the redistribution layer and/or the die. As a result, wafer-level packaged devices are placed in conventional test sockets for stress testing only after attaching the dies to a substrate. One drawback of this approach is that if a die is inoperable or defective, the entire packaged device is generally discarded. This problem is particularly acute in packages with multiple dies because one or more operable dies may be discarded with the defective die.

Packaged microelectronic devices can also be produced by "build-up" packaging. For example, a sacrificial substrate can be attached to a panel that includes a plurality of microelectronic dies and an organic filler that couples the dies together. The sacrificial substrate is generally a ceramic disc that is attached to the active sides of the dies. Next, the back sides of the dies are thinned and a ceramic layer is attached to the back sides. The sacrificial substrate is then removed from the active sides of the dies and build-up layers or a redistribution layer is formed on the active sides of the dies. Packaged devices using a build-up approach on a sacrificial substrate provide high pin counts in a small area and a reasonably robust structure.

The build-up packaging process described above, however, has several drawbacks. For example, the build-up process is relatively expensive and may not be used on equipment set up for circular substrates. Furthermore, the resulting packaged microelectronic devices may not be stacked on top of each other to reduce the surface area or "footprint" of the devices on a printed circuit board. Accordingly, there is a need for an efficient and cost-effective process to package microelectronic devices that are stackable.

BRIEF DESCRIPTION OF THE DRAWINGS

FIGS. 1A-1G illustrate stages in one embodiment of a method for manufacturing a plurality of microelectronic devices.

FIG. 1A is a schematic side cross-sectional view of a portion of a microfeature workpiece including a substrate and a plurality of dies formed in and/or on the substrate.

FIG. 1B is a schematic side cross-sectional view of a microelectronic device assembly including a plurality of singulated dies arranged on a removable support member.

FIG. 1C is a schematic side cross-sectional view of the microelectronic device assembly after removing the support member from the dies and depositing a first dielectric layer.

FIG. 1D is a schematic side cross-sectional view of the microelectronic device assembly after forming a plurality of conductive links.

FIG. 1E is a schematic side cross-sectional view of the microelectronic device assembly after depositing a second dielectric layer onto the conductive links and the first dielectric layer.

FIG. 1F is a schematic side cross-sectional view of the microelectronic device assembly after forming a plurality of ball-pads.

FIG. 1G is a schematic side cross-sectional view of a singulated microelectronic device in a test socket.

DETAILED DESCRIPTION

A. Overview

Figure 1B:
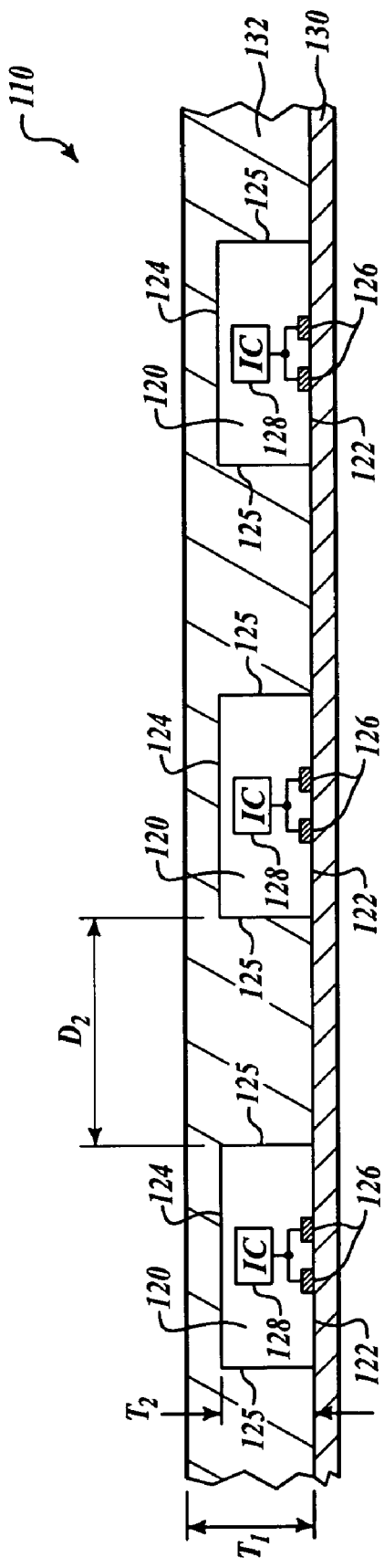

The following disclosure describes several embodiments of microelectronic devices and methods for manufacturing microelectronic devices. An embodiment of one such method includes (a) attaching a plurality of singulated microelectronic dies to a removable support member with an active side of the individual dies facing toward the support member, and (b) depositing a flowable material onto the dies and a portion of the removable support member such that the flowable material covers a back side of the individual dies and is disposed between adjacent dies. The method further includes removing the support member from the active sides of the dies after depositing the flowable material.

Another aspect of the invention is directed to methods for manufacturing microelectronic devices having microelectronic dies. The individual microelectronic dies include an active side, a plurality of terminals on the active side, and a back side opposite the active side. In one embodiment, a method includes coupling the microelectronic dies to a support member with the active sides facing toward the support member, covering a portion of the individual dies and a portion of the support member between adjacent dies with a dielectric material, detaching the support member from the dies, cutting the dielectric material between adjacent dies to separate the dies, and placing a separated die in a testing device such that a support surface of the testing device contacts the dielectric material outboard the die.

In another embodiment, a method includes attaching the active sides of the microelectronic dies to a removable member and partially encasing the dies by depositing a dielectric material onto the dies and a portion of the removable member. This embodiment further includes decoupling the removable member from the active sides of the dies, cutting the dielectric material between adjacent dies to separate the dies, stress testing a separated die, and coupling the separated die to a support member after stress testing. As such, the dies are tested under stress (e.g., heat and operation) before being mounted to the support member.

Another aspect of the invention is directed to microelectronic devices. In one embodiment, a microelectronic device includes a substrate and a die attached to the substrate. The substrate includes a plurality of first contacts, and the die includes an active side, a plurality of terminals on the active side, a back side opposite the active side, and a plurality of ends extending between the active side and the back side. The microelectronic device further includes a casing covering the ends of the die and a redistribution structure on the die and the casing. The redistribution structure has a plurality of second contacts positioned outboard the die. The microelectronic device further includes a plurality of wire-bonds electrically connecting the first contacts on the substrate to corresponding second contacts on the redistribution structure.

In another embodiment, a packaged microelectronic device includes a substrate and a known good die attached to the substrate. The known good die, for example, can be a die that has passed a stress test under heat and operating conditions. The substrate includes a plurality of contacts, and the known good die includes an active side, a plurality of terminals on the active side, a back side opposite the active side, and a plurality of ends extending between the active side and the back side. The microelectronic device further includes a casing over the ends of the die and an encapsulant covering the known good die, the casing, and a portion of the substrate.

In another embodiment, a set of stacked microelectronic devices includes a support member, a first microelectronic device attached to the support member, and a second microelectronic device attached to the first microelectronic device. The first microelectronic device includes (a) a first die having an active side electrically coupled to the support member, a back side opposite the active side, a plurality of ends extending between the active side and the back side, and a first footprint, (b) a first casing covering the ends of the first die, and (c) a second footprint. The second microelectronic device includes (a) a second die having an active side electrically coupled to the support member, a back side opposite the active side, a plurality of ends extending between the active side and the back side, and a third footprint at least approximately equal to the first footprint, (b) a second casing covering the ends of the second die, and (c) a fourth footprint different than the second footprint.

Specific details of several embodiments of the invention are described below with reference to microelectronic devices including microelectronic dies and interposer substrates, but in other embodiments the microelectronic devices can include other components. For example, the microelectronic devices can include a microfeature workpiece upon which and/or in which micromechanical components, data storage elements, optics, read/write components, or other features are fabricated. Microfeature workpieces can be semiconductor wafers such as silicon or gallium arsenide wafers, glass substrates, insulative substrates, and many other types of materials. Moreover, the microelectronic devices can include a single microelectronic component or an assembly of multiple components. Also, several other embodiments of the invention can have different configurations, components, or procedures than those described in this section. A person of ordinary skill in the art, therefore, will accordingly understand that the invention may have other embodiments with additional elements, or the invention may have other embodiments without several of the elements shown and described below with reference to FIGS. 1A-7.

B. Embodiments of Methods for Manufacturing Microelectronic Devices

FIGS. 1A-1G illustrate stages in one embodiment of a method for manufacturing a plurality of microelectronic devices. For example, FIG. 1A is a schematic side cross-sectional view of a portion of a microfeature workpiece 100 including a substrate 102 and a plurality of microelectronic dies 120 (only three are shown) formed in and/or on the substrate 102. The individual dies 120 include an active side 122, a back side 124 opposite the active side 122, a plurality of terminals 126 (e.g., bond-pads) arranged in an array on the active side 122, and an integrated circuit 128 (shown schematically) operably coupled to the terminals 126. Although the illustrated dies 120 have the same structure, in other embodiments the dies may have different features to perform different functions. In either case, the dies 120 are formed on the microfeature workpiece 100 in an arrangement in which the dies 120 are spaced apart from each other by a first distance $D_1$. After forming the dies 120, the microfeature workpiece 100 is cut along lines A-A to singulate the dies 120.

FIG. 1B is a schematic side cross-sectional view of a microelectronic device assembly 110 including a plurality of singulated dies 120 arranged in an array on a removable support member 130. The singulated dies 120 are attached to the support member 130 with the active sides 122 of the dies 120 facing the support member 130. The individual singulated dies 120 include a plurality of ends 125 extending between the active side 122 and the back side 124. The dies 120 are placed on the support member 130 so that the ends 125 of adjacent dies 120 are spaced apart by a second distance $D_2$ greater than the first distance $D_1$ (FIG. 1A) between adjacent dies 120 on the workpiece 100 (FIG. 1A). The removable support member 130 can be a release film or tape (e.g., a film with an adhesive on one side) that releasably attaches to the dies 120 and protects the active sides 122 of the dies 120 during several processing procedures. For example, in several applications, the removable support member 130 is configured to be detached from the dies 120 at room temperature without leaving a residue on the dies 120. The support member 130 can be a circular member that advantageously can be used on equipment set up for circular workpieces.

After attaching the singulated dies 120 to the removable support member 130, a flowable dielectric material 132 is deposited onto the dies 120 and across the exposed areas of the removable support member 130 between adjacent dies 120. The dielectric material 132 has a thickness $T_1$ greater than a height $T_2$ of the dies 120 such that the dielectric material 132 covers the back sides 124 and the ends 125 of the dies 120. The dielectric material 132 can be deposited by molding (e.g., compression molding) or other suitable processes. After depositing the dielectric material 132, the device assembly 110 can be heated to at least partially cure the dielectric material 132.

Figure 1C:
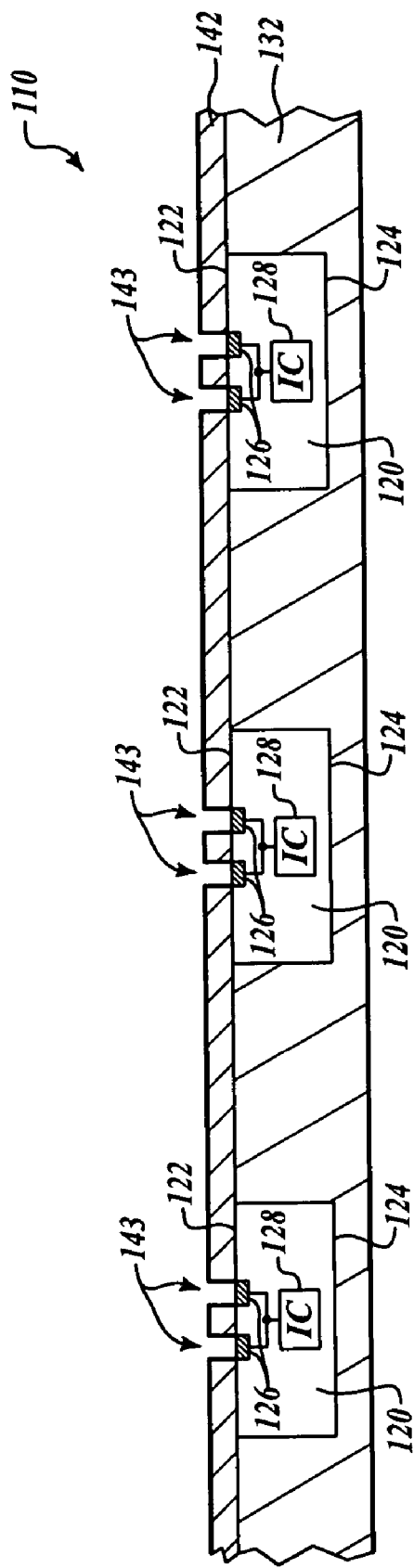

FIG. 1C is a schematic side cross-sectional view of the microelectronic device assembly 110 after removing the support member 130 from the active sides 122 of the dies 120. After exposing the active sides 122 of the dies 120, a first dielectric layer 142 is deposited across the device assembly 110 and over the active sides 122 of the dies 120. The first dielectric layer 142 can be formed by spin-on, film lamination, or other suitable techniques. A plurality of vias 143 are then formed in the first dielectric layer 142. The vias 143 are aligned with and expose corresponding terminals 126 of the dies 120. The vias 143 can be formed by etching, drilling, or other suitable methods.

Figure 1D:
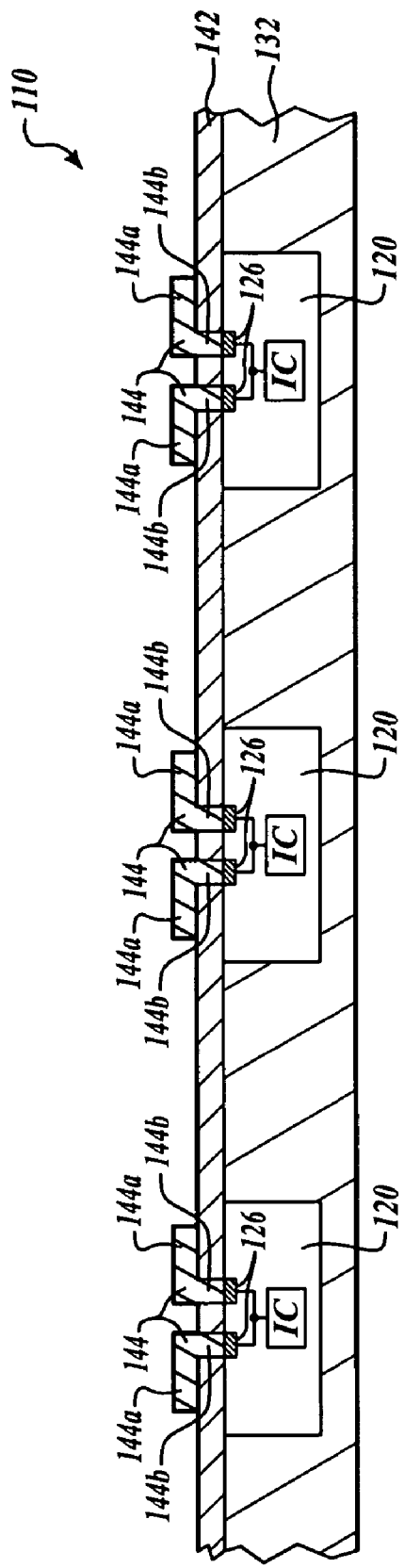

FIG. 1D is a schematic side cross-sectional view of the microelectronic device assembly 110 after forming a plurality of conductive links 144. The individual conductive links 144 include a horizontal portion 144a extending along the exposed surface of the first dielectric layer 142 and a vertical portion 144b in a corresponding via 143 (FIG. 1C). The vertical portions 144b of the conductive links 144 electrically couple the horizontal portions 144a to the terminals 126 of the die 120. As a result, each terminal 126 has a corresponding conductive link 144. The conductive links 144 can be formed by depositing a seed layer and then plating a conductive material onto the seed layer or other suitable processes.

Figure 1E:
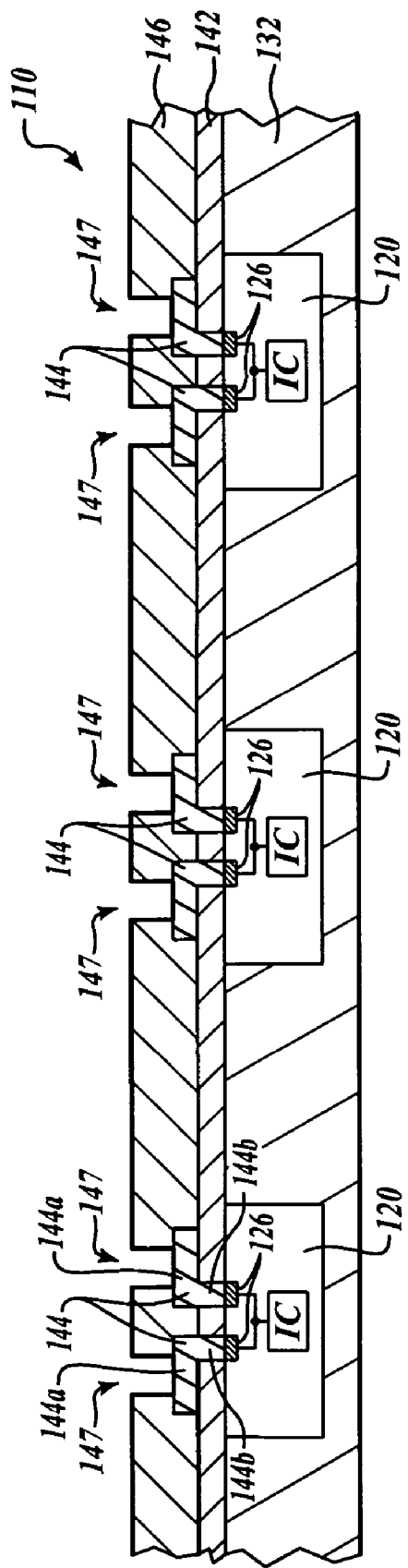

FIG. 1E is a schematic side cross-sectional view of the microelectronic device assembly 110 after depositing a second dielectric layer 146 onto the conductive links 144 and the first dielectric layer 142. Next, portions of the second dielectric layer 146 are removed to form vias 147 that extend to the conductive links 144. The vias 147 can be formed proximate to the ends of the conductive links 144.

Figure 1F:
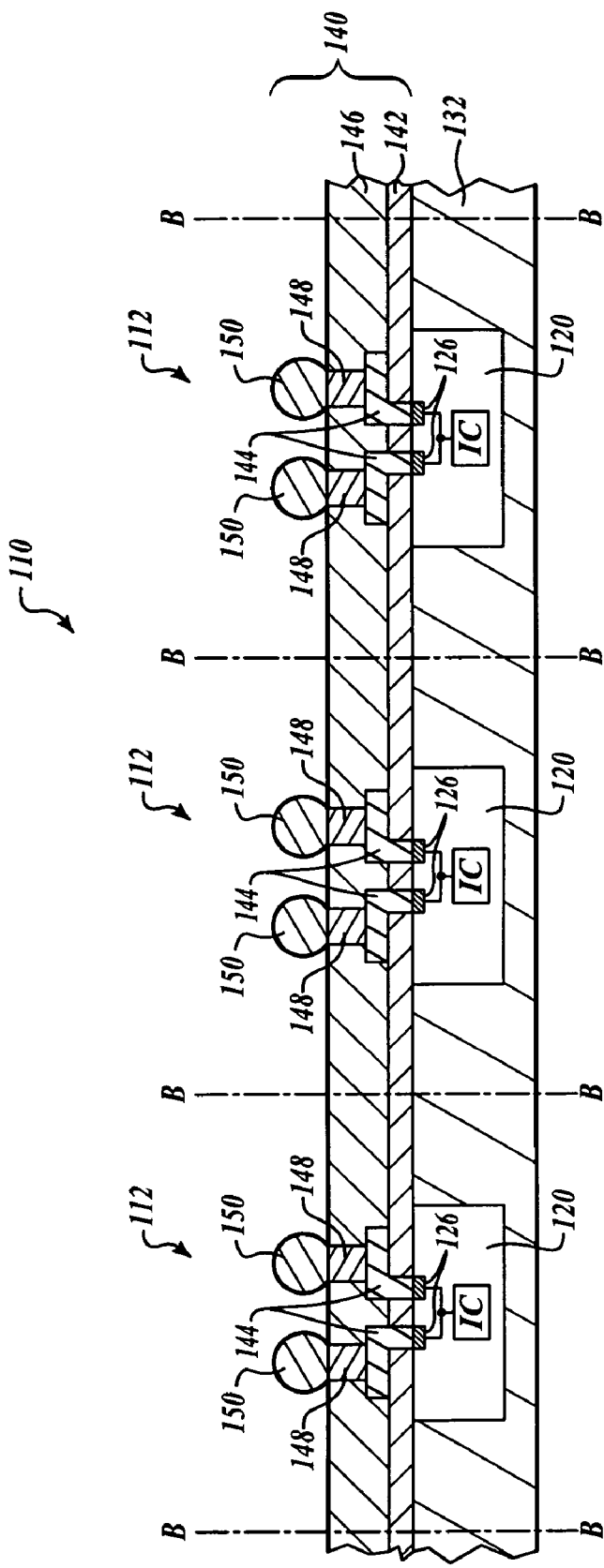

FIG. 1F is a schematic side cross-sectional view of the microelectronic device assembly 110 after forming a plurality of ball-pads 148 in corresponding vias 147. After forming the ball-pads 148, a plurality of interconnect elements 150 (e.g., solder balls) are placed on corresponding ball-pads 148. The interconnect elements 150 are electrically connected to corresponding terminals 126 on the microelectronic dies 120, and thus the interconnect elements 150, the ball-pads 148, and the conductive links 144 form a redistribution structure 140 on the dies 120. In the illustrated embodiment, the interconnect elements 150 are arranged directly over the microelectronic dies 120. In other embodiments, such as the embodiment described below with reference to FIG. 2, the conductive links 144 can have different lengths and, accordingly, the ball-pads 148 and the interconnect elements 150 can be positioned outboard the dies 120. In additional embodiments, the microelectronic device assembly 110 may not include the redistribution structure 140, but rather the interconnect elements 150 can be formed directly on the terminals 126. In either case, the device assembly 110 is cut along lines B-B to singulate a plurality of individual microelectronic devices 112.

Figure 1G:
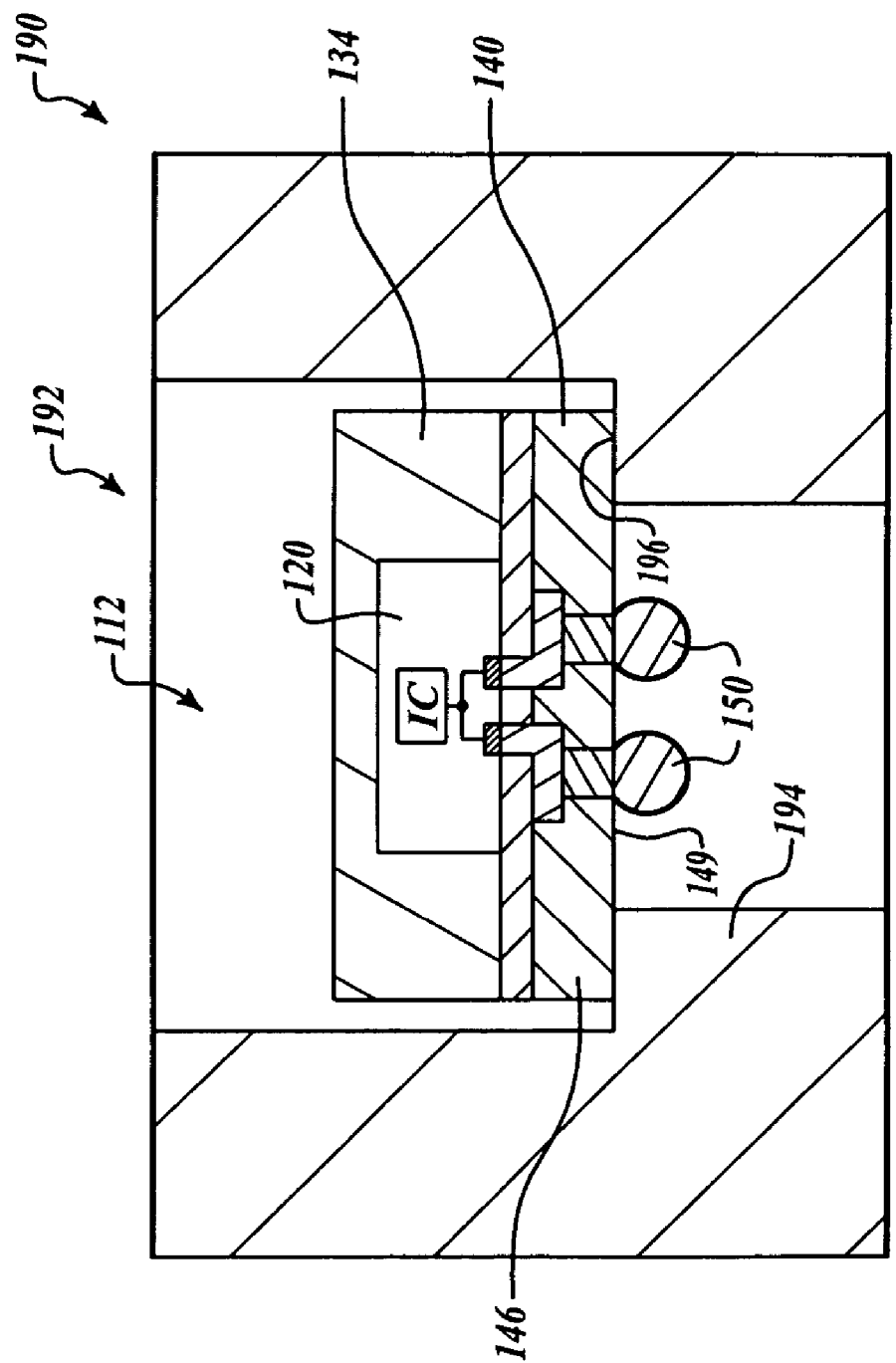

FIG. 1G is a schematic side cross-sectional view of a singulated microelectronic device 112 placed in a test socket 190 of a testing apparatus for stress testing the device 112. The singulated device 112 includes a casing 134 covering the die 120 and sized to fit within the test socket 190. In the test socket 190, the microelectronic device 112 can be heated to a typical operating temperature to test the performance of the die 120 at typical operating conditions. The illustrated test socket 190 includes an opening 192 sized to receive the microelectronic device 112 and a shelf 194 within the opening 192 for supporting the device 112. The shelf 194 includes a support surface 196 positioned to contact an exterior surface 149 of the redistribution structure 140 outboard the die 120. In other embodiments, the support surface 196 may contact the redistribution structure 140 at least partially inboard the die 120.

One feature of the microelectronic device 112 illustrated in FIG. 1G is that the casing 134 covers the ends 125 of the die 120. As a result, the redistribution structure 140 can be formed on the casing 134 and the die 120 and include a portion outboard the die 120. An advantage of this feature is that the support surface 196 of the test socket 190 only contacts the portion of the redistribution structure 140 that is outboard the die 120 and the conductive elements of the redistribution structure 140. Accordingly, if the test socket 190 accumulates debris on the support surface 196, the debris is not likely to damage the die 120 or the conductive elements of the redistribution structure 140. Therefore, the microelectronic device 112 can be tested before attachment to an external substrate.

C. Additional Embodiments of Microelectronic Device Assemblies

Figure 2:
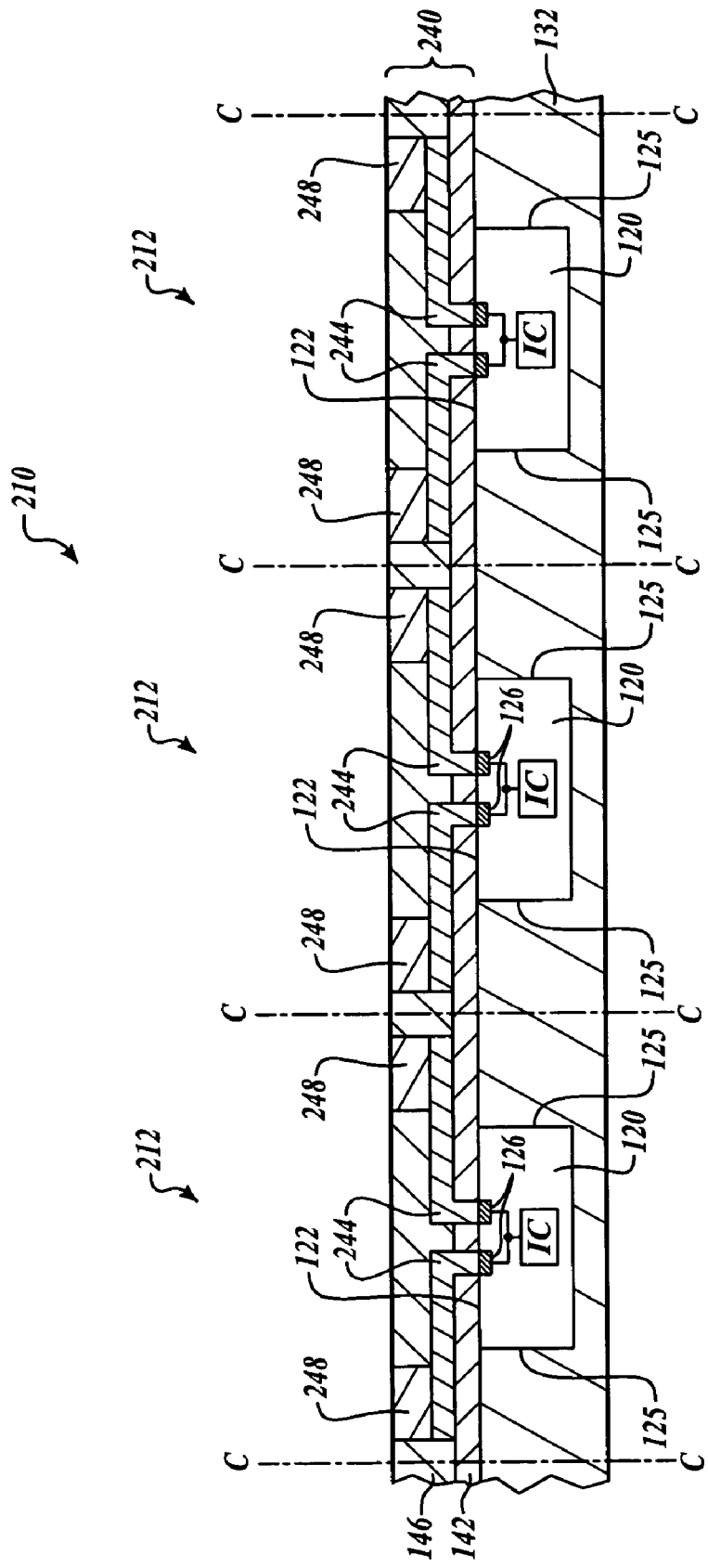
FIG. 2 is schematic side cross-sectional view of a microelectronic device assembly in accordance with another embodiment of the invention.

FIG. 2 is a schematic side cross-sectional view of a microelectronic device assembly 210 in accordance with another embodiment of the invention. The illustrated device assembly 210 is generally similar to the device assembly 110 described above with reference to FIG. 1F. For example, the assembly 210 includes a plurality of microelectronic dies 120, a dielectric material 132 partially encasing the dies 120, and a redistribution structure 240 formed on the active sides 122 of the dies 120 and the dielectric material 132. The illustrated redistribution structure 240, however, includes a plurality of pads 248 formed outboard the dies 120 and a plurality of conductive links 244 electrically connecting the pads 248 to corresponding terminals 126. The pads 248 can be configured for attachment to wire-bonds, solder balls, or other electrical connectors. In either case, the device assembly 210 can be cut along lines C-C to singulate a plurality of individual microelectronic devices 212. In several applications, the dies 120 in the device assembly 210 can be spaced apart from each other such that the test socket 190 (FIG. 1G) contacts the redistribution structure 240 outboard the pads 248. In other embodiments, however, the test socket 190 may contact the pads 248.

D. Embodiments of Packaged Stacks of Microelectronic Devices

Figure 3:
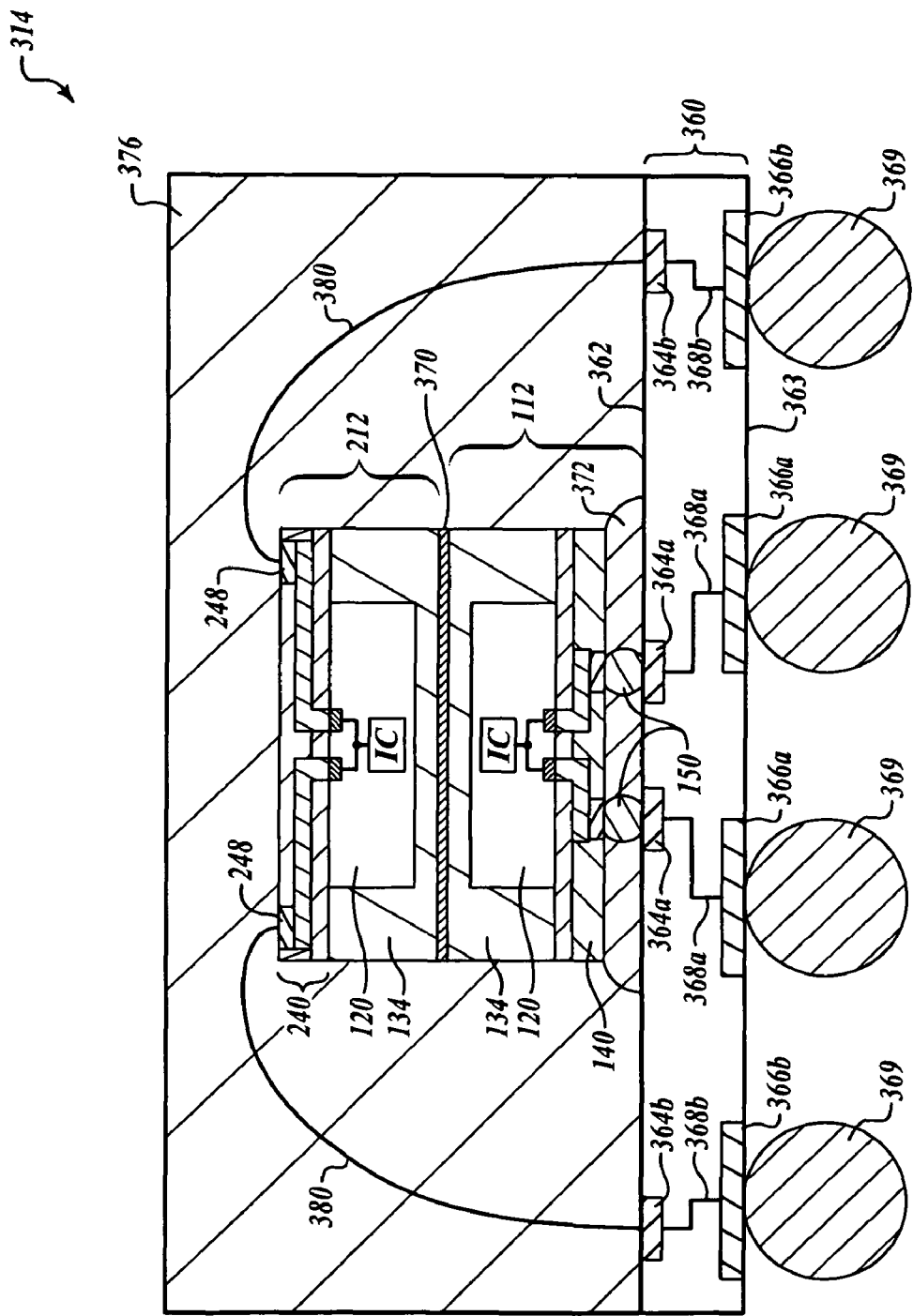
FIG. 3 is a schematic side cross-sectional view of a packaged stack of microelectronic devices in accordance with one embodiment of the invention.

FIG. 3 is a schematic side cross-sectional view of a packaged microelectronic device stack 314 in accordance with one embodiment of the invention. The illustrated stack 314 includes a support member 360, a first microelectronic device 112 attached to the support member 360, and a second microelectronic device 212 attached to the first microelectronic device 112. The first and second microelectronic devices 112 and 212 are generally similar to the devices described above with reference to FIGS. 1F and 2, respectively. The support member 360 can be a lead frame or a substrate, such as a printed circuit board, for carrying the microelectronic devices 112 and 212. The illustrated support member 360 includes a first side 362 attached to the first microelectronic device 112 and a second side 363 opposite the first side 362. The first side 362 includes (a) a plurality of first contacts 364a arranged in an array for attachment to corresponding interconnect elements 150 on the first microelectronic device 112, and (b) a plurality of second contacts 364b arranged in an array for attachment to corresponding pads 248 on the second microelectronic device 212. The second side 363 includes (a) a plurality of first ball-pads 366a electrically coupled to corresponding first contacts 364a with first conductive traces 368a, and (b) a plurality of second ball-pads 366b electrically connected to corresponding second contacts 364b with second conductive traces 368b. The first and second ball-pads 366a-b are arranged in an array to receive corresponding electrical couplers 369 (e.g., solder balls).

The first microelectronic device 112 is attached to the support member 360 with the redistribution structure 140 facing the first side 362 and the interconnect elements 150 coupled to corresponding first contacts 364a. In several embodiments, the stack 314 may further include an underfill material 372 between the second dielectric layer 146 of the first microelectronic device 112 and the first side 362 of the support member 360. The second microelectronic device 212 is attached to the first microelectronic device 112 with an adhesive 370 and positioned such that the redistribution structure 240 faces away from the first microelectronic device 112. The illustrated stack 314 further includes (a) a plurality of wire-bonds 380 electrically coupling the pads 248 of the second microelectronic device 212 to corresponding second contacts 364b on the support member 360, and (b) an encapsulant 376 encasing the first and second microelectronic devices 112 and 212, the wire-bonds 380, and the first side 362 of the support member 360.

One feature of the packaged microelectronic device stack 314 illustrated in FIG. 3 is that the first and second microelectronic devices 112 and 212 are stacked on top of each other. An advantage of this feature is that stacking the devices 112 and 212 increases the capacity and/or performance of a device within a given surface area or footprint on a circuit board. For example, when the second microelectronic device 212 is stacked on top of the first microelectronic device 112, the second microelectronic device 212 is electrically and operably coupled to the support member 360 without using significantly more surface area on the support member 360.

Another feature of the packaged microelectronic device stack 314 illustrated in FIG. 3 is that the first and second microelectronic devices 112 and 212 both include known good dies 120 because the dies 120 in the devices 112 and 212 are tested before the devices 112 and 212 are attached to the support member 360. An advantage of this feature is that defective dies and devices can be excluded from the stack 314. This increases the yield of the packaged stacks of microelectronic devices and reduces the number of stacks that malfunction and/or include defects.

Figure 4:
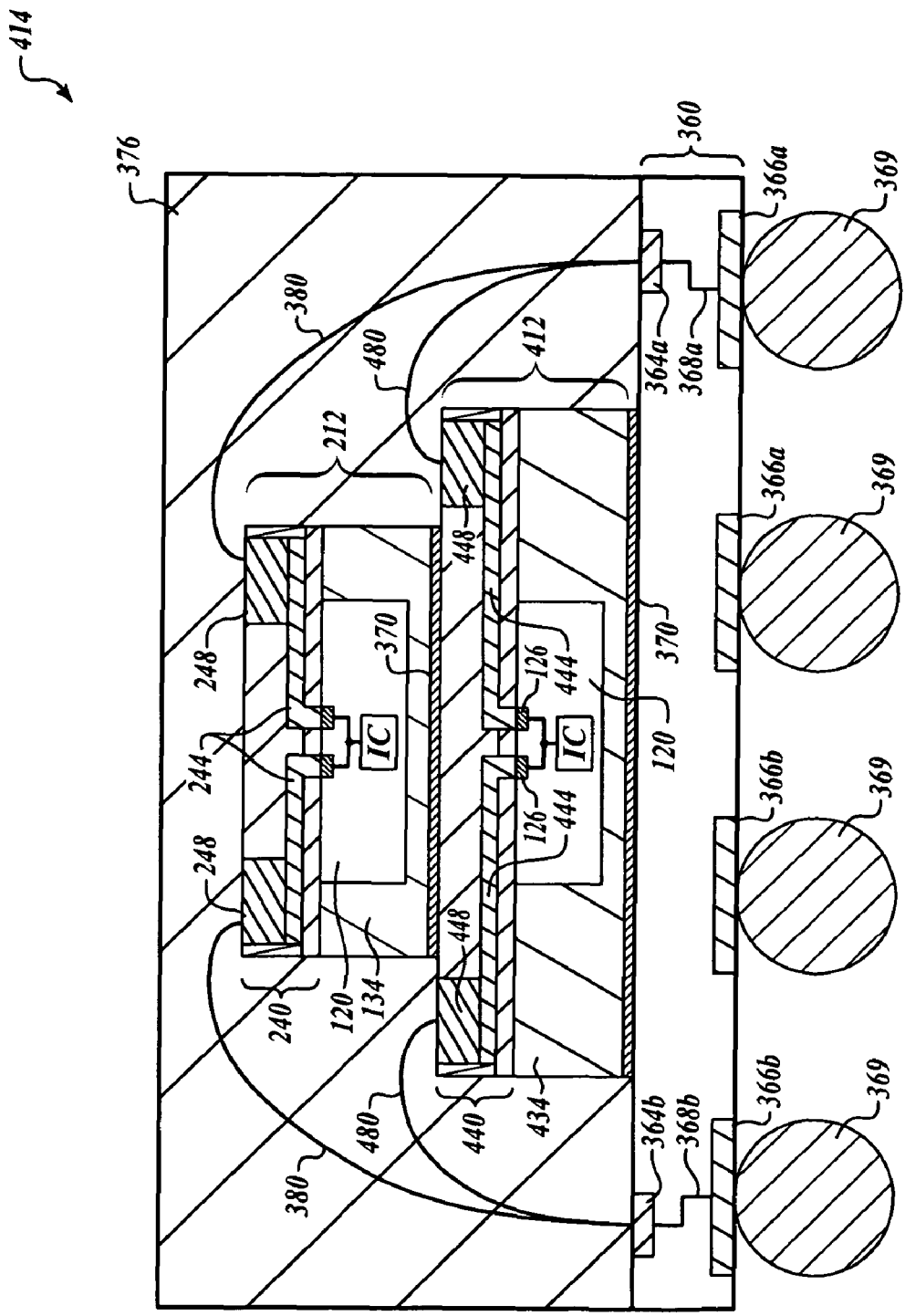
FIG. 4 is a schematic side cross-sectional view of a packaged stack of microelectronic devices in accordance with another embodiment of the invention.

FIG. 4 is a schematic side cross-sectional view of a packaged microelectronic device stack 414 in accordance with another embodiment of the invention. The illustrated stack 414 is generally similar to the stack 314 described above with reference to FIG. 3. For example, the illustrated stack 414 includes a support member 360, a first microelectronic device 412 attached to the support member 360, and a second microelectronic device 212 attached to the first microelectronic device 412. In the illustrated stack 414, however, the first microelectronic device 412 includes a redistribution structure 440 that faces away from the support member 360, and the second microelectronic device 212 is attached to the redistribution structure 440. The illustrated redistribution structure 440 includes a plurality of pads 448 positioned outboard the second microelectronic device 212 and electrically coupled to corresponding first contacts 364a on the support member 360 with wire-bonds 480.

One feature of the packaged microelectronic device stack 414 illustrated in FIG. 4 is that the footprint of the first microelectronic device 412 is larger than the footprint of the second microelectronic device 212 even though the footprints of the dies 120 in the first and second devices 412 and 212 are the same. An advantage of this feature is that the difference in the footprints of the first and second microelectronic devices 412 and 212 enables the second microelectronic device 212 to be stacked on top of the first microelectronic device 412.

Figure 5:
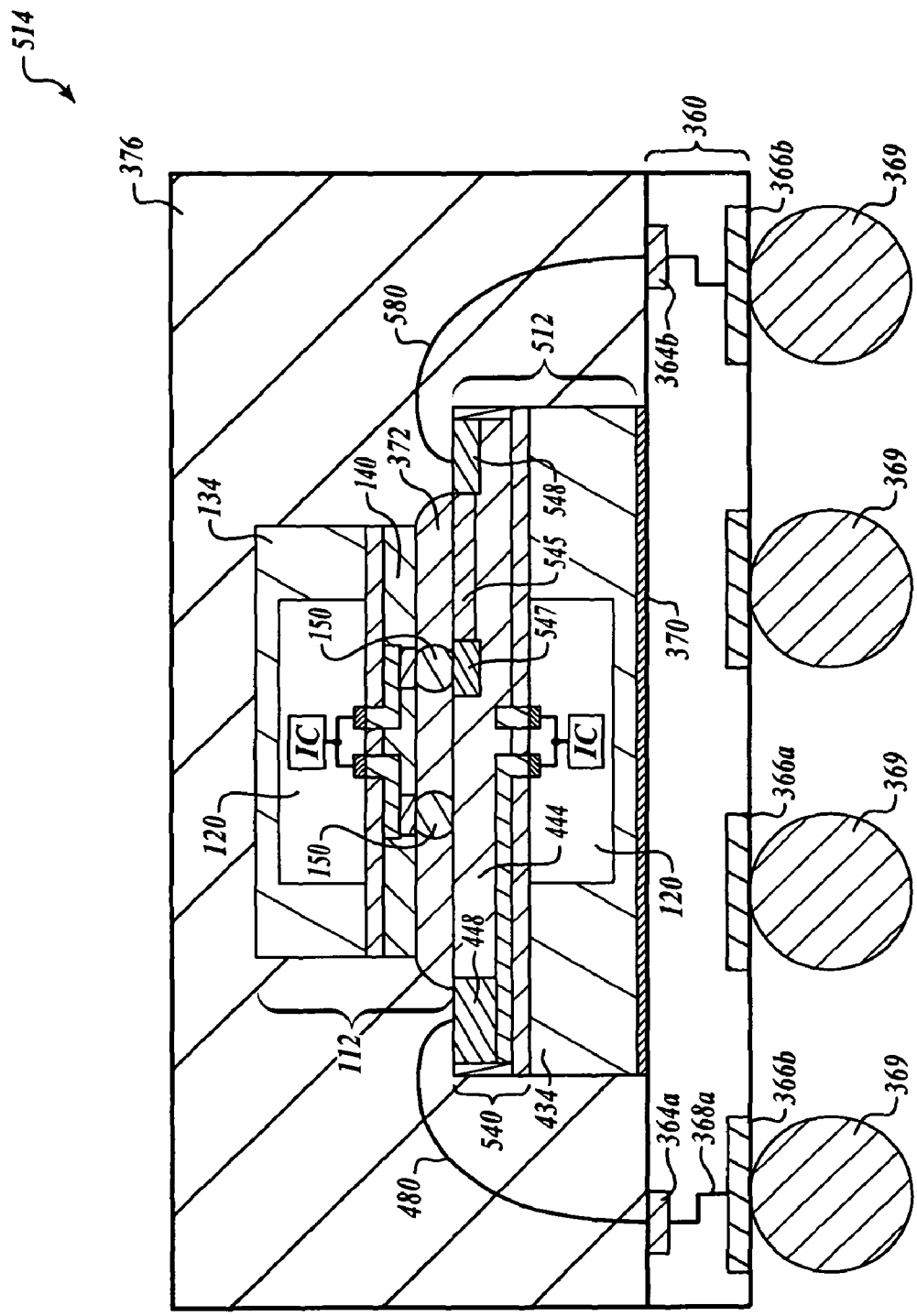
FIG. 5 is a schematic side cross-sectional view of a packaged stack of microelectronic devices in accordance with another embodiment of the invention.

FIG. 5 is a schematic side cross-sectional view of a packaged microelectronic device stack 514 in accordance with another embodiment of the invention. The illustrated stack 514 is generally similar to the stacks 314 and 414 described above with reference to FIGS. 3 and 4, respectively. For example, the illustrated stack 514 includes a support member 360, a first microelectronic device 512 attached to the support member 360, and a second microelectronic device 112 attached to the first microelectronic device 512. In the illustrated embodiment, however, the second microelectronic device 112 is positioned such that the redistribution structure 140 faces toward the first microelectronic device 512 and is electrically coupled to a redistribution structure 540 on the first microelectronic device 512. Specifically, the redistribution structure 540 on the first microelectronic device 512 includes (a) a plurality of first pads 547 (only one shown in FIG. 5) arranged in an array for connection to corresponding interconnect elements 150, (b) a plurality of second pads 548 (only one shown in FIG. 5) arranged in an array outboard the second microelectronic device 112 for electrical coupling to the support member 360, and (c) a plurality of traces 545 (only one shown in FIG. 5) electrically connecting the first pads 547 to corresponding second pads 548. The stack 514 further includes a plurality of wire-bonds 580 electrically coupling the second pads 548 to corresponding second contacts 364b on the support member 360. As a result, the die 120 in the second microelectronic device 112 is electrically coupled to the support member 360 via the redistribution structure 140 of the second microelectronic device 112, the redistribution structure 540 of the first microelectronic device 512, and the wire-bonds 580.

Figure 6:
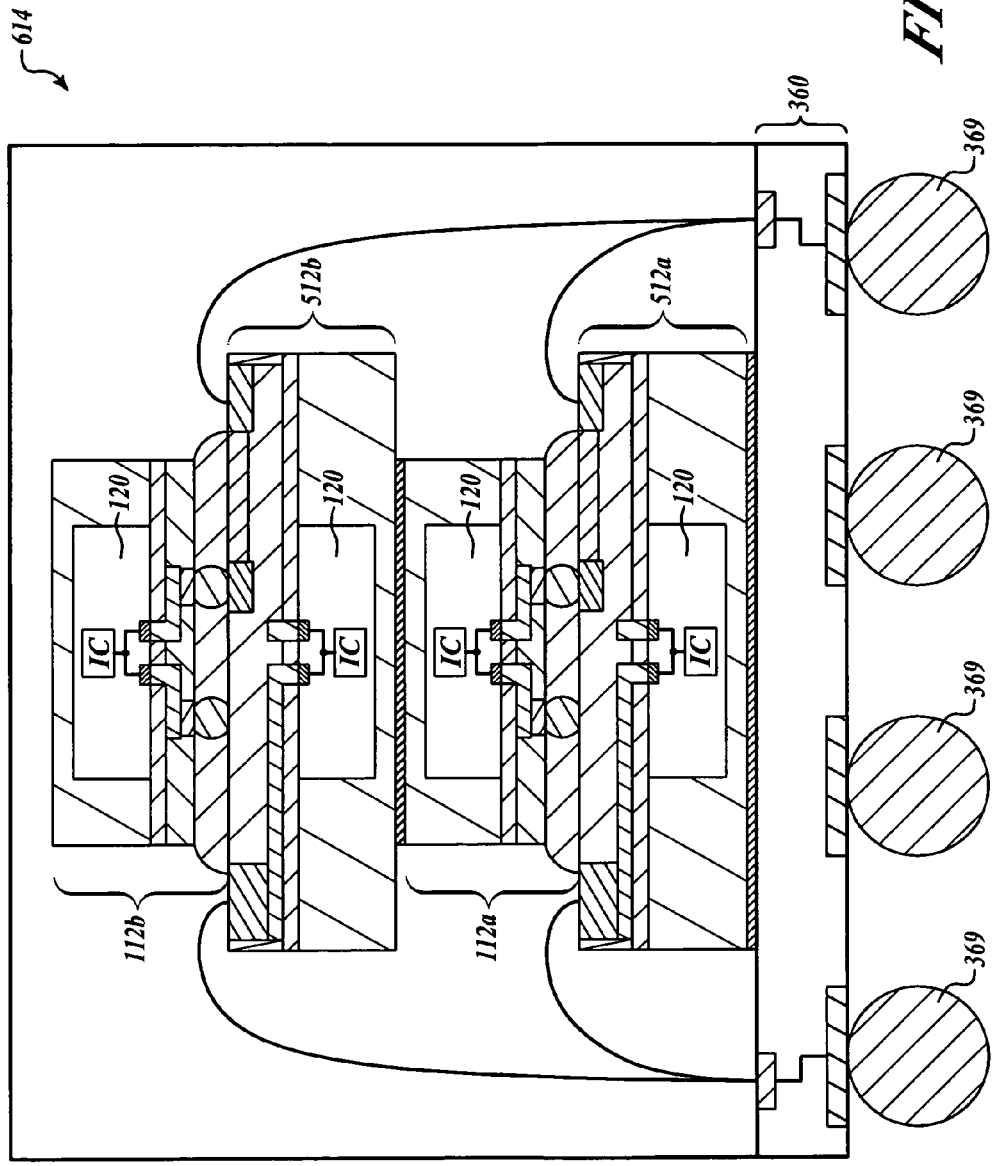
FIG. 6 is a schematic side cross-sectional view of a packaged stack of microelectronic devices in accordance with another embodiment of the invention.

FIG. 6 is a schematic side cross-sectional view of a packaged microelectronic device stack 614 in accordance with another embodiment of the invention. The illustrated stack 614 is generally similar to the stack 514 described above with reference to FIG. 5. The illustrated stack 614, however, includes four microelectronic devices instead of two microelectronic devices. Specifically, the stack 614 includes a support member 360, a first microelectronic device 512a attached to the support member 360, a second microelectronic device 112a attached to the first microelectronic device 512a, a third microelectronic device 512b attached to the second microelectronic device 112a, and a fourth microelectronic device 112b attached to the third microelectronic device 512b. In the illustrated embodiment, the first and third microelectronic devices 512a-b have the same configuration, and the second and fourth microelectronic devices 112a-b have the same configuration. In other embodiments, the stack 614 can include a different number of microelectronic devices and the devices can have different configurations.

Figure 7:
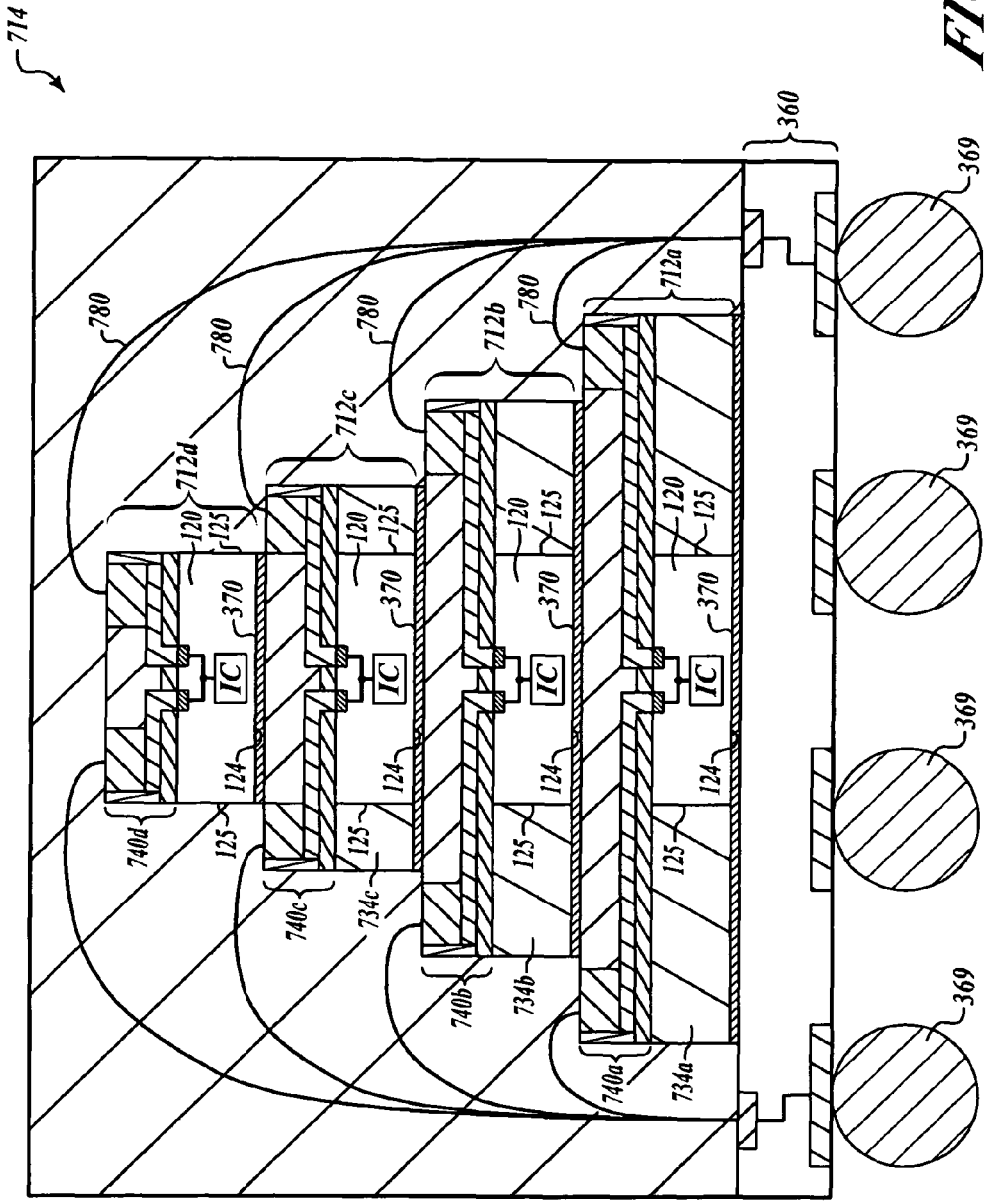
FIG. 7 is a schematic side cross-sectional view of a packaged stack of microelectronic devices in accordance with another embodiment of the invention.

FIG. 7 is a schematic side cross-sectional view of a packaged microelectronic device stack 714 in accordance with another embodiment of the invention. The illustrated stack 714 is generally similar to the stack 414 described above with reference to FIG. 4. For example, the illustrated stack 714 includes a support member 360 and a plurality of microelectronic devices 712 (identified individually as 712a-d) attached to the support member 360 in a stacked arrangement. The first, second, and third microelectronic devices 712a-c each include a die 120, a casing 734 (identified individually as 734a-c), and a redistribution structure 740 (identified individually as 740a-c) formed on the die 120 and the casing 734. The illustrated casings 734a-c cover the ends 125 of the dies 120, but do not cover the back sides 124 of the dies 120. As such, the back sides 124 of the dies 120 are attached directly to the redistribution structure 740 of the adjacent device 712 with an adhesive 370. The first, second, and third microelectronic devices 712a-c can be formed according to the method described above with reference to FIGS. 1A-1F except that the microelectronic device assembly 110 is thinned to expose the back sides 124 of the dies 120 before singulation. In other embodiments, however, the microelectronic devices 712a-c can be formed with other methods. In additional embodiments, one or more casings 734 may cover the back sides 124 of corresponding dies 120.

The fourth microelectronic device 712d includes a die 120 and a redistribution structure 740d formed on the die 120. The fourth microelectronic device 712d, however, does not include a casing covering a portion of the die 120. In other embodiments, the fourth microelectronic device 712d may include a casing covering a portion of the die 120, and/or may not include the redistribution structure 470d. In either case, the stack 714 includes a plurality of wire-bonds 780 electrically coupling the dies 120 to the support member 360.

One feature of the packaged microelectronic device stack 714 illustrated in FIG. 7 is that the microelectronic devices 712 do not include a casing covering the back sides 124 of the dies 120. An advantage of this feature is that eliminating the casing between the back sides 124 of the dies 120 and the adjacent microelectronic devices 712 reduces the vertical profile or height of the stack 714.

From the foregoing, it will be appreciated that specific embodiments of the invention have been described herein for purposes of illustration, but that various modifications may be made without deviating from the spirit and scope of the invention. For example, many of the elements of one embodiment can be combined with other embodiments in addition to or in lieu of the elements of the other embodiments. Accordingly, the invention is not limited except as by the appended claims.

We claim:

1. A method for manufacturing microelectronic devices, the method comprising:
   attaching a plurality of singulated microelectronic dies to a removable support member with an active side of the individual dies contacting the support member, wherein the active sides of the dies include electrical terminals, and individual dies have a first lateral edge and a second lateral edge opposite the first lateral edge;
   molding a flowable material onto the dies and at least a portion of the removable support member such that the molded material covers a back side of the individual dies and is disposed between adjacent dies;
   removing the support member from the active sides of the dies;
   forming redistribution structures, wherein individual redistribution structures are formed at a corresponding die and include conductive links electrically connected to electrical terminals of the corresponding die, ball-pads electrically coupled to the conductive links, and first and second dielectric layers having a peripheral region extending across the molded material outboard from the bond-pads;
   cutting the molded material, the first dielectric layer and the second dielectric layer between adjacent lateral edges of each neighboring die to singulate the dies, wherein the cut molded material forms individual casings having a peripheral portion extending laterally outward from the dies, wherein the peripheral region of the first and second dielectric layers is supported by the peripheral portion of the casing, and wherein the peripheral region of the first and second dielectric layers extends outboard of the bond-pads from both the first and second opposing lateral edges of each die and outboard of the conductive links of the redistribution structures; and
   supporting the singulated die with a testing device with a support surface of the testing device contacting only the peripheral region of the second dielectric layer of the singulated die.

2. The method of claim 1, further comprising:
   stress testing a first separated die;
   coupling the first separated die to a substrate after stress testing; and
   attaching a second separated die to the first separated die such that the first separated die is positioned between the second separated die and the substrate.

3. The method of claim 1, wherein the casing covers the back side of the die, and the method further comprises coupling the casing to a substrate such that the casing is between the backside of the die and the substrate.

4. The method of claim 1 wherein attaching the singulated dies to the removable support member comprises coupling the singulated dies to a releasable film.

5. The method of claim 1 wherein molding the flowable material comprises:
   placing the singulated dies and at least a portion of the removable support member in a mold cavity; and
   flowing a mold compound into the mold cavity and onto the dies.

6. The method of claim 1, further comprising:
   forming the dies on a microfeature workpiece with the dies spaced apart by a first distance; and
   cutting the microfeature workpiece to separate the dies from each other before attaching the singulated dies to the removable support member;
   wherein attaching the singulated dies comprises arranging the dies on the removable support member with the dies spaced apart by a second distance greater than the first distance.

7. The method of claim 1, further comprising:
   heating and operating at least one of the separated dies to stress test the at least one separated die.

8. A method for manufacturing microelectronic devices having microelectronic dies, the individual microelectronic dies including an active side, a plurality of terminals on the active side, and a back side opposite the active side, the method comprising:
   coupling the microelectronic dies to a support member with the active sides attached directly to the support member;
   molding a flowable dielectric material such that the molded dielectric material covers at least a portion of the individual dies and at least a portion of the support member between adjacent dies;
   detaching the support member from the dies and the molded dielectric material;
   forming redistribution structures on the active sides of the dies and the molded dielectric material, wherein individual redistribution structures have a plurality of bond pads and a dielectric peripheral region extending outwardly from the dies across the molded dielectric material;

cutting the dielectric material between adjacent dies to separate at least some of the at least partially covered dies; and placing at least one separated die in a testing device with a support surface of the testing device contacting only the dielectric peripheral region of the redistribution structure outboard the bond pads.

9. The method of claim 8 wherein placing at least one separated die in the testing device comprises positioning a first separated die in the testing device, and wherein the method further comprises:

attaching and electrically connecting the first separated die to a substrate;

coupling a second separated die to the first separated die such that the first separated die is positioned between the second separated die and the substrate; and electrically connecting the second separated die to the substrate.

10. The method of claim 8 wherein:

placing at least one separated die in the testing device comprises positioning at least one separated die in a thermal stress testing device; and the method further comprises attaching the at least one separated die to a substrate after positioning the die in the thermal stress testing device.

11. A method for packaging a microelectronic device, the method comprising:

attaching a microelectronic device to a support member, the support member having a plurality of support member terminals and conductive traces electrically coupled to the support member terminals, and the microelectronic device including (a) a die having an active side, a back side opposite the active side facing the support member, and a plurality of ends extending between the active side and the back side, including a first lateral end and a second lateral end opposite the first lateral end, (b) a casing covering at least a portion of the ends of the die and having a peripheral portion extending laterally outward from the ends of the dies, and (c) a redistribution structure on the active side of the die and the peripheral portion of the casing, the redistribution structure having a plurality of bond-pads and a dielectric layer having a peripheral region extending outboard of the bond-pads from both the first and second opposing lateral ends by a distance sufficient to contact a support surface of a testing device;

wire-bonding the contacts of the redistribution structure to corresponding terminals on the support member;

encapsulating the microelectronic device, the wire-bonds, and at least a portion of the support member; and supporting the microelectronic device with the testing device, with the support surface of the testing device contacting only the peripheral region of the dielectric layer.

12. The method of claim 11 wherein attaching the microelectronic device to the support member comprises coupling a microelectronic device with a known good die to the support member.

13. The method of claim 11 wherein:

the microelectronic device comprises a first microelectronic device;

the method further comprises coupling a second microelectronic device to the redistribution structure on the first microelectronic device between the contacts of the redistribution structure such that the first microelectronic device is positioned between the second microelectronic device and the support member, the second microelectronic device including (a) a die having an active side, a back side opposite the active side, and a plurality of ends extending between the active side and the back side, and (b) a casing covering at least a portion of the ends of the die; and encapsulating the microelectronic device, the wire-bonds, and at least a portion of the support member comprises encasing the first and second microelectronic devices, the wire-bonds, and at least a portion of the support member.

14. The method of claim 11 wherein the microelectronic device comprises a first microelectronic device, wherein the terminals comprise a plurality of first terminals, wherein the support member further comprises a plurality of second terminals, and wherein the method further comprises:

coupling a second microelectronic device to the first microelectronic device such that the first microelectronic device is positioned between the second microelectronic device and the support member, the second microelectronic device including (a) a die having an active side, a back side opposite the active side, and a plurality of ends extending between the active side and the back side, (b) a casing covering at least a portion of the ends of the die, and (c) a redistribution structure on the active side of the die and the casing, the redistribution structure having a plurality of contacts positioned outboard the die; and wire-bonding the contacts of the second microelectronic device to corresponding second terminals on the support member.

15. The method of claim 11, further comprising stress testing the microelectronic device before attaching the microelectronic device to the support member.

16. The method of claim 11, further comprising testing the microelectronic device in the testing device before attaching the microelectronic device to the support member.

17. The method of claim 11, further comprising encasing the back side and the ends of the die before attaching the microelectronic device to the support member.

* * * * *